(12) United States Patent
Wu et al.

(10) Patent No.: US 11,514,991 B1
(45) Date of Patent: Nov. 29, 2022

(54) PROGRAM TAIL PLANE COMPARATOR FOR NON-VOLATILE MEMORY STRUCTURES

(71) Applicant: SanDisk Technologies LLC, Addison, TX (US)

(72) Inventors: Fanqi Wu, Milpitas, CA (US); Hua-Ling Hsu, Fremont, CA (US); Deepanshu Dutta, Fremont, CA (US); Huai-yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 29 days.

(21) Appl. No.: 17/307,285

(22) Filed: May 4, 2021

(51) Int. Cl.
*G11C 16/34* (2006.01)
*G11C 16/04* (2006.01)
*G11C 16/10* (2006.01)
*G11C 29/50* (2006.01)
*G11C 16/26* (2006.01)

(52) U.S. Cl.
CPC ...... *G11C 16/3459* (2013.01); *G11C 16/0483* (2013.01); *G11C 16/10* (2013.01); *G11C 16/3418* (2013.01); *G11C 29/50004* (2013.01); *G11C 16/26* (2013.01); *G11C 2029/5004* (2013.01)

(58) Field of Classification Search
None
See application file for complete search history.

(56) References Cited

U.S. PATENT DOCUMENTS

| | | | |
|---|---|---|---|
| 7,907,449 B2 | 3/2011 | Lee et al. | |
| 9,269,446 B1 | 2/2016 | Magia et al. | |
| 9,418,751 B1 | 8/2016 | Dutta et al. | |
| 10,141,064 B1 | 11/2018 | Periyannan et al. | |
| 10,529,435 B2 | 1/2020 | Puthenthermadam et al. | |
| 2017/0123994 A1 | 5/2017 | Pandya et al. | |

*Primary Examiner* — Guerrier Merant
(74) *Attorney, Agent, or Firm* — Dickinson Wright PLLC; Steven C. Hurles

(57) ABSTRACT

A method for detecting and isolating defective memory plane(s) of a non-volatile memory structure during a program verify operation, comprising: initiating, for each plane, a word line verify voltage level scan with a bit scan pass fail criterion and at a starting voltage located within an intended program threshold voltage distribution curve, incrementally decreasing the word line verify voltage by a predetermined offset until a specific condition of the scan is obtained, and storing the voltage at which the specific condition of the scan is obtained, wherein the stored voltage represents a voltage of an upper tail portion of an actual programmed threshold voltage distribution curve of the plane. The stored voltages of all of the memory planes of the structure are compared to determine which plane corresponds to the lowest stored voltage. A "fail" status is applied to the plane corresponding to the lowest stored voltage.

20 Claims, 17 Drawing Sheets

PROGRAM TAIL PLANE COMPARATOR FOR NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for programming non-volatile memory structures.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as binary data), the possible threshold voltages ($V_{th}$) of the memory cell are divided into two ranges, wherein the ranges are assigned as logical data "1" and "0" respectively. A memory cell characterized by this type of storage density may be referred to as a "single-level cell" or SLC.

By further partitioning the threshold voltage window of a memory cell into additional distinct voltage ranges, multiple levels of information can be stored. Such a memory cell may be referred to as a "multi-state cell." For example, to store two bits of data, the threshold voltage window of a cell may be partitioned into four distinct voltage ranges (or states), wherein each range is assigned a certain bit value that is equal to, for example, "11," "10," "01," and "00." Accordingly, after an erase operation, the threshold voltage is negative and, therefore, may be defined as logic "11." Therefore, the positive threshold voltages may be used for the states of "10," "01", "00." A memory cell of this storage density may be referred to as, for example, a "multi-level cell" or MLC. In another example, to store three bits of data, the voltage threshold window of a cell may be partitioned into eight distinct voltage ranges (or states), wherein each range is assigned a certain bit value that is equal to, for example, "111," "110," "100," "010," "011," "000," "001," and "101." A memory cell of this storage density may be referred to, for example, as a "tri-level" or "triple-level cell" (TLC). In a further example, to store four bits of data, the voltage threshold window of a memory cell may be partitioned into 16 distinct voltage ranges (or states), wherein each voltage range is assigned a certain bit value that is equal to, for example, "1111," "1110," "1100," "1000," "0111," "0011," "0001," "0000," "0001," "1001," "1101," "1011," "0110," "0100," "0101," and "1010." A memory cell of this type of storage density may be referred to, for example, as a "quad-level cell" (QLC).

The specific relationship between the data that is programmed into a memory cell and the threshold voltage levels of the memory cell depends upon the data encoding scheme that is adopted for the memory cells.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure. However, the lack of separation between the charge trapping regions of the memory cells in three-dimensional array structures provide further challenges with respect to the reliability and the retention of the programmed data.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in an increased number of manufacturing, memory operation, and performance errors. For example, potentially catastrophic structural defects that occur between neighboring components, such as electrical shorting between adjacent word lines, occur more readily in compacted spaces. The description below chiefly addresses the deleterious effects of having one or more defective memory planes in a multi-plane memory structure. More specifically, according to various observations, the presence of a defective memory plane in a scalable memory structure could disrupt (e.g., pull down) the programming voltage (VPGM) applied during a programming operation, thereby preventing the continued and complete programming of the non-defective plane(s) existing downstream of the defective plane. As a result, the programming operation fails, or is rendered incomplete, and a partial sector of the memory is left unused despite that it contains non-defective plane(s). This condition may be referred to as a neighbor plane disturb (NPD). In response, various countermeasures may be employed to detect and isolate one or more defective memory planes from the surrounding memory structure, thereby restoring or permitting the programming operation for the non-defective plane(s). For example, where applicable, such countermeasures may utilize a comparison of successive programming loops between various planes and apply fail criteria. However, in the specific case of an SLC-type programming operation, in which there is only a single programming loop (i.e., a single programming pulse and a single verify operation), a detection mode that requires a comparison between multiple programming loops is unusable. Thus, it would be beneficial to derive a device mode that can detect and isolate one or more defective plane(s) within a memory structure, even in the course of an SLC-type programming operation, as well as permit the successive programming of the non-defective plane(s) of the memory structure.

SUMMARY

Various exemplary embodiments include a method for detecting and isolating one or more defective memory planes of a non-volatile memory structure during a program verify operation in which it is determined that a programming memory operation of more than one memory plane of the memory structure has failed. The method comprises, for each plane of the memory structure: initiating a word line verify voltage level scan according to a bit scan pass fail criterion (BSPF), and at a starting voltage level located within an intended program threshold voltage distribution curve according to the programming memory operation; incrementally decreasing the word line verify voltage level by a predetermined offset voltage until a specific condition of the word line verify voltage level scan is obtained; and storing the voltage level at which the specific condition of the word line verify voltage level scan is obtained, wherein the stored word line verify voltage represents a voltage of an upper tail portion of an actual programmed threshold voltage distribution curve of the corresponding memory plane. Further, the method comprises comparing the stored word line verify voltage levels of all of the memory planes of the memory structure to determine which plane corresponds to the lowest stored word line verify voltage level and applying a "fail" status to the memory plane corresponding to the lowest stored word line verify voltage level.

Other exemplary embodiments include a memory controller comprising a first port configured to couple to a non-volatile memory, wherein the memory comprises a memory structure. The memory controller is configured to, during a program verify operation in which it is determined that a programming memory operation with respect to more than one plane of the memory structure has failed: for each memory plane, initiate a word line verify voltage level scan according to a bit scan pass fail criterion (BSPF) at a starting voltage level located within an intended program threshold voltage distribution curve according to the programming memory operation; incrementally decrease the word line verify voltage level by a predetermined offset voltage until a specific condition of the word line verify voltage level scan is obtained; and store the voltage level at which the specific condition of the word line verify voltage level scan is obtained, wherein the stored word line verify voltage level represents a voltage of an upper tail portion of an actual programmed threshold voltage distribution curve of the corresponding memory plane. Further, the memory controller is configured to compare the stored word line verify voltage levels of all of the memory planes of the memory structure to determine which of the planes corresponds to the lowest stored word line verify voltage level and to apply a "fail" status to the memory plane corresponding to the lowest stored word line verify voltage level.

Additional exemplary embodiments include a non-volatile memory system that is comprised of a memory structure and a memory controller coupled to the memory structure, in which, during a program verify operation in which it is determined a programming memory operation of more than one memory plane of the memory structure has failed, initiating, with respect to each memory plane, a word line verify voltage level scan according to a bit scan pass fail criterion (BSPF) at a starting voltage level located within an intended program threshold voltage distribution curve according to the programming memory operation; incrementally decreasing the word line verify voltage level by a predetermined offset voltage until a specific condition of the word line verify voltage level scan is obtained; and storing the voltage level at which the specific condition of the word line verify voltage level scan is obtained, wherein the stored word line verify voltage level represents a voltage of an upper tail portion of an actual programmed threshold voltage distribution curve of the corresponding memory plane, and still further, comparing the stored word line verify voltage levels of all of the memory planes of the memory structure to determine which of the planes corresponds to the lowest stored word line verify voltage level and applying a "fail" status to the memory plane corresponding to the lowest stored word line verify voltage level.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
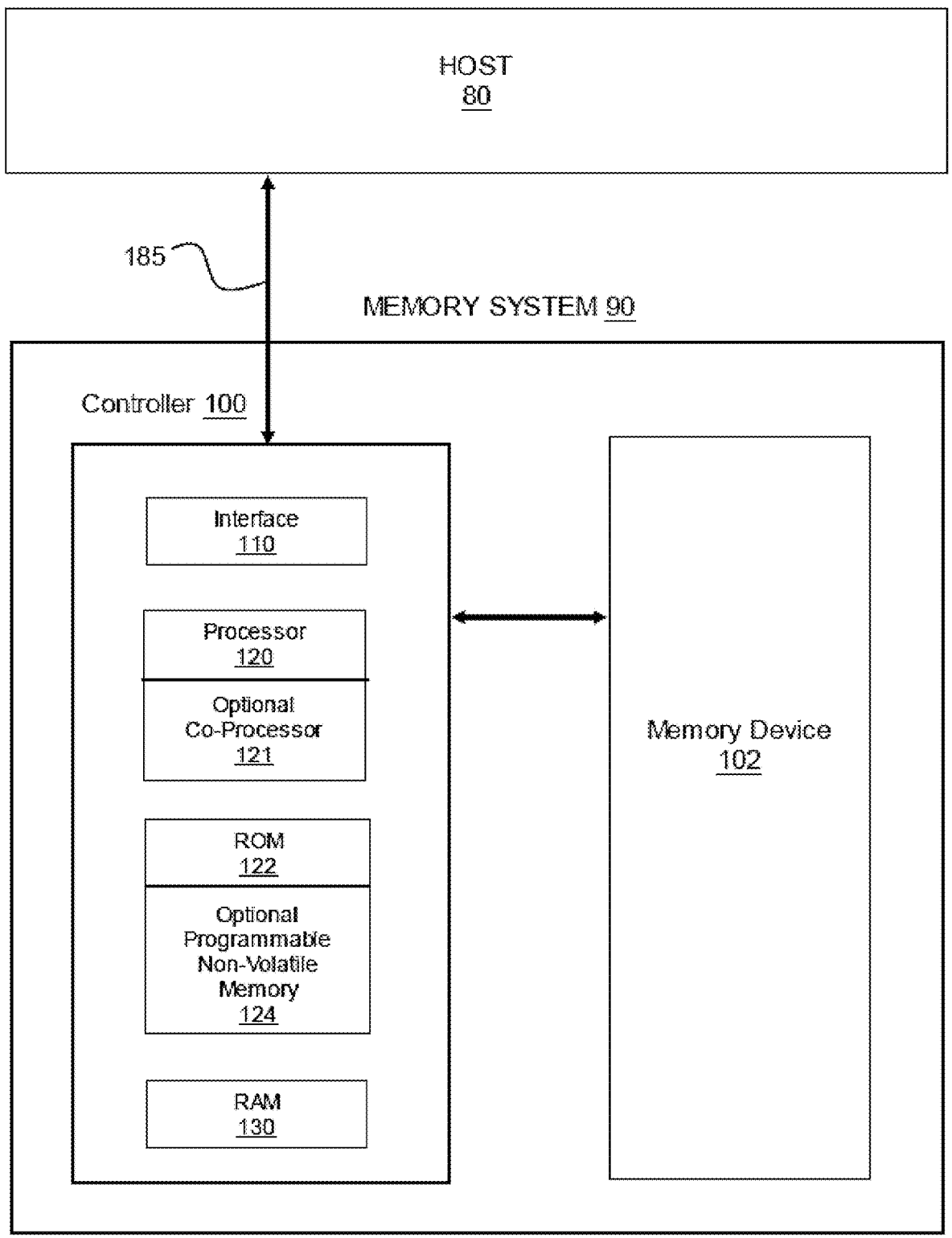
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
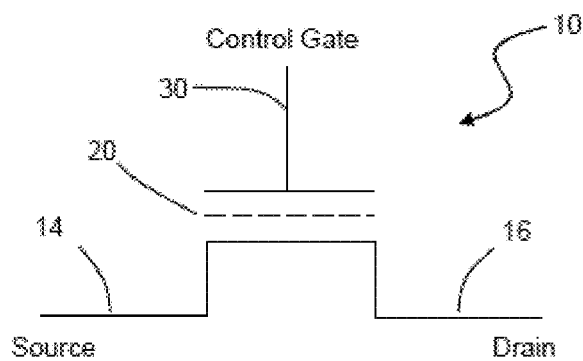
FIG. 2 is a schematic depiction of a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a bit line.

Figure 3:
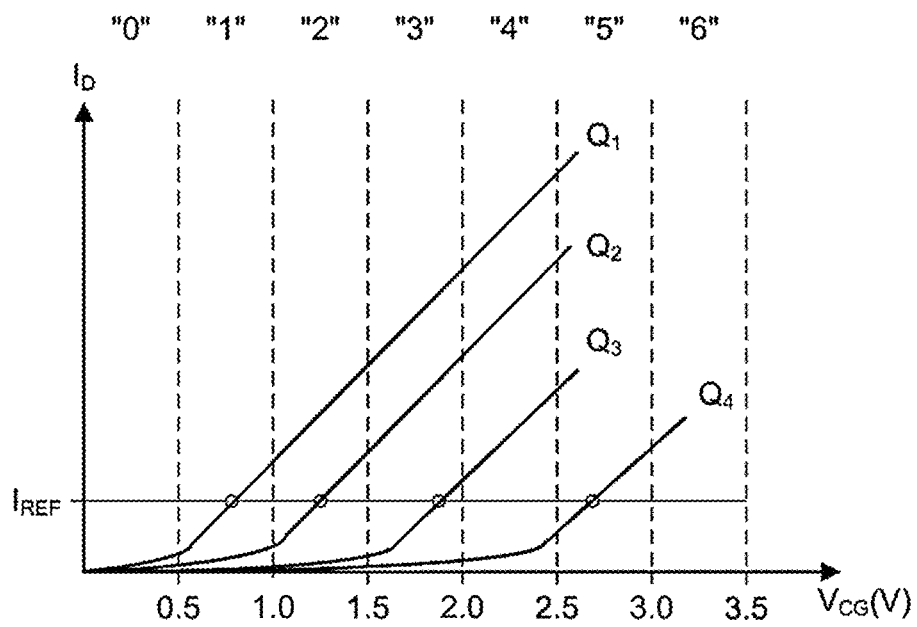
FIG. 3 depicts the relationship between a source-drain current ID and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 µA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
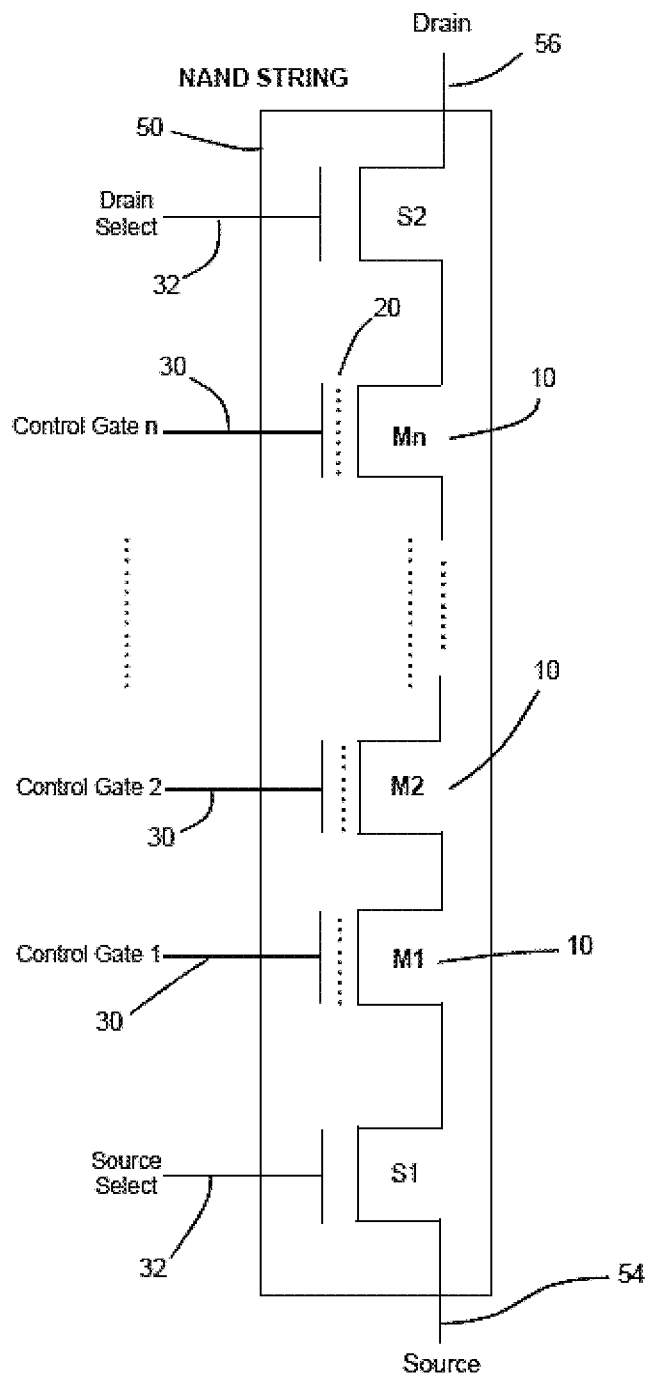
FIG. 4A schematically depicts a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
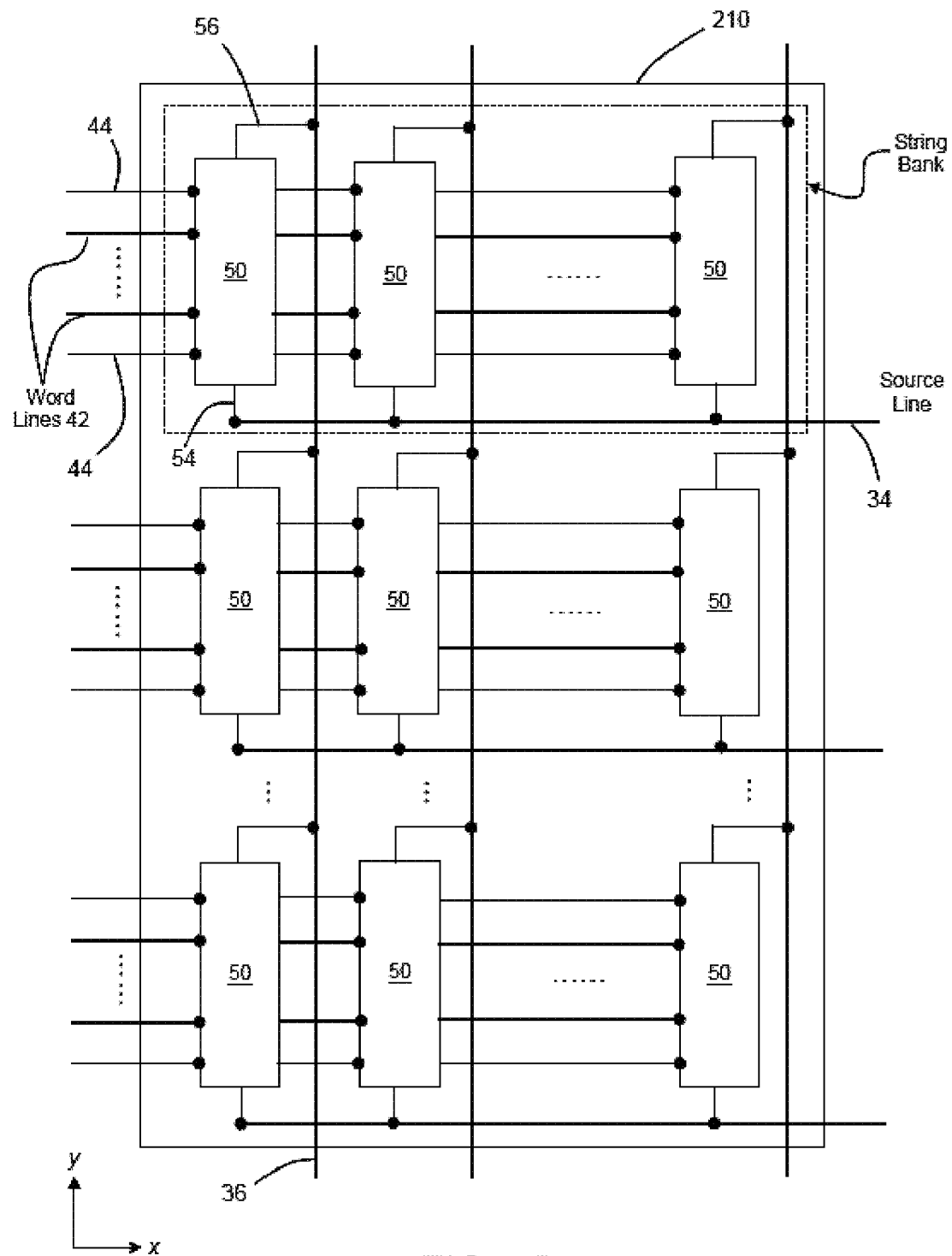
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
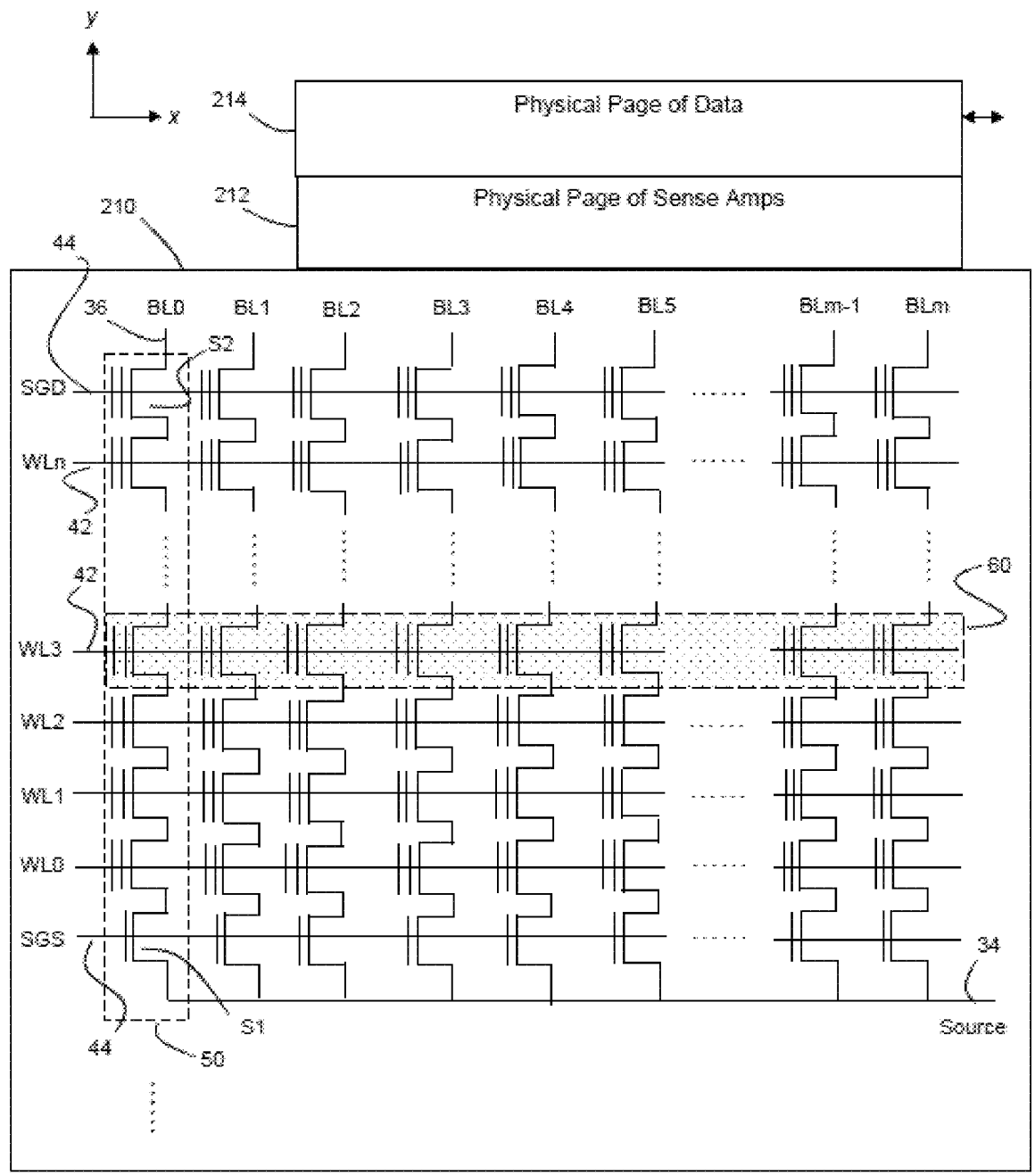
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, BLm-1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
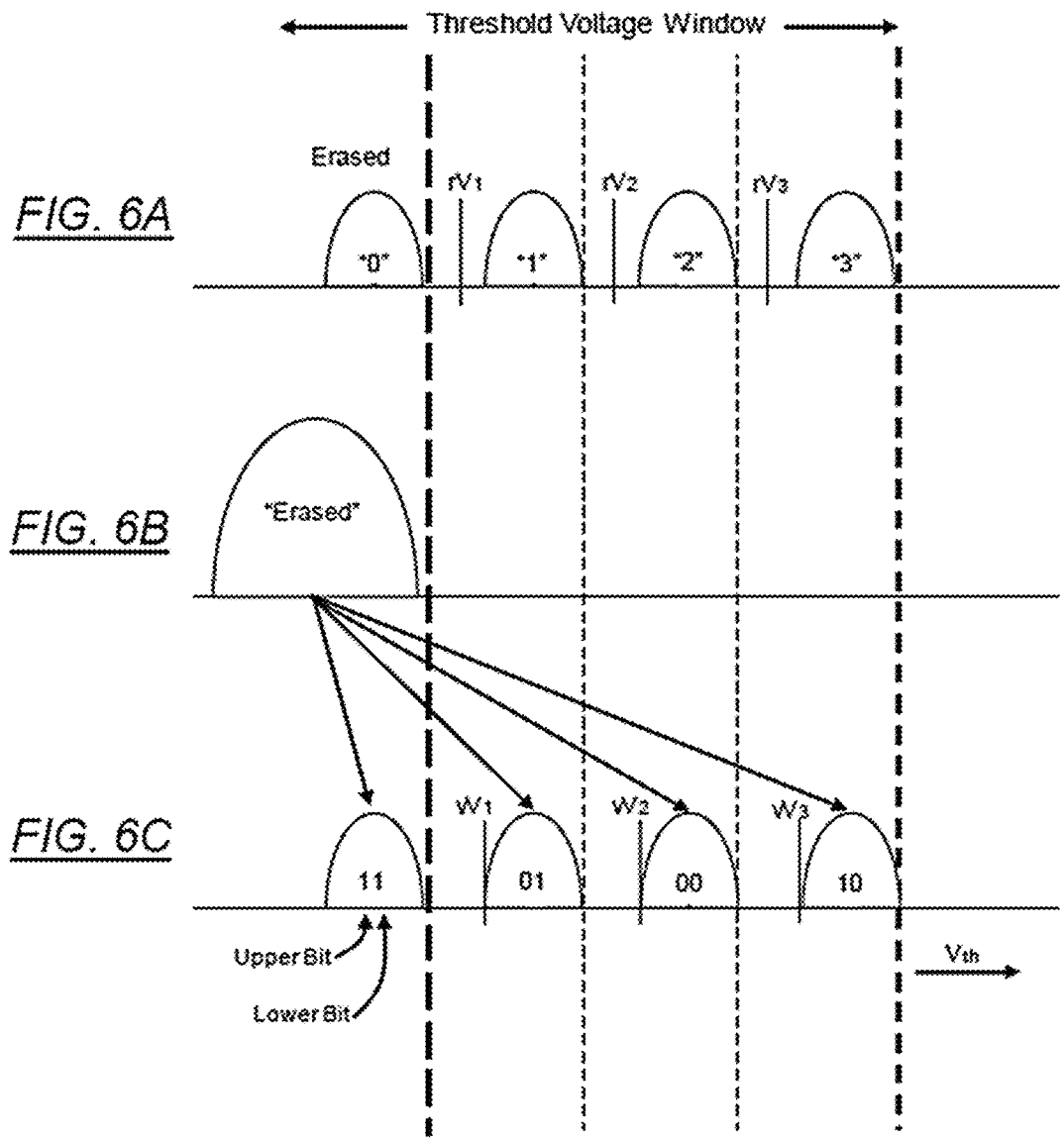
FIGS. 6A-6C depict stages of programming four states of a population of MLC NAND-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages $rV_1$, $rV_2$, and $rV_3$ in three sub-passes respectively.

Figure 7:
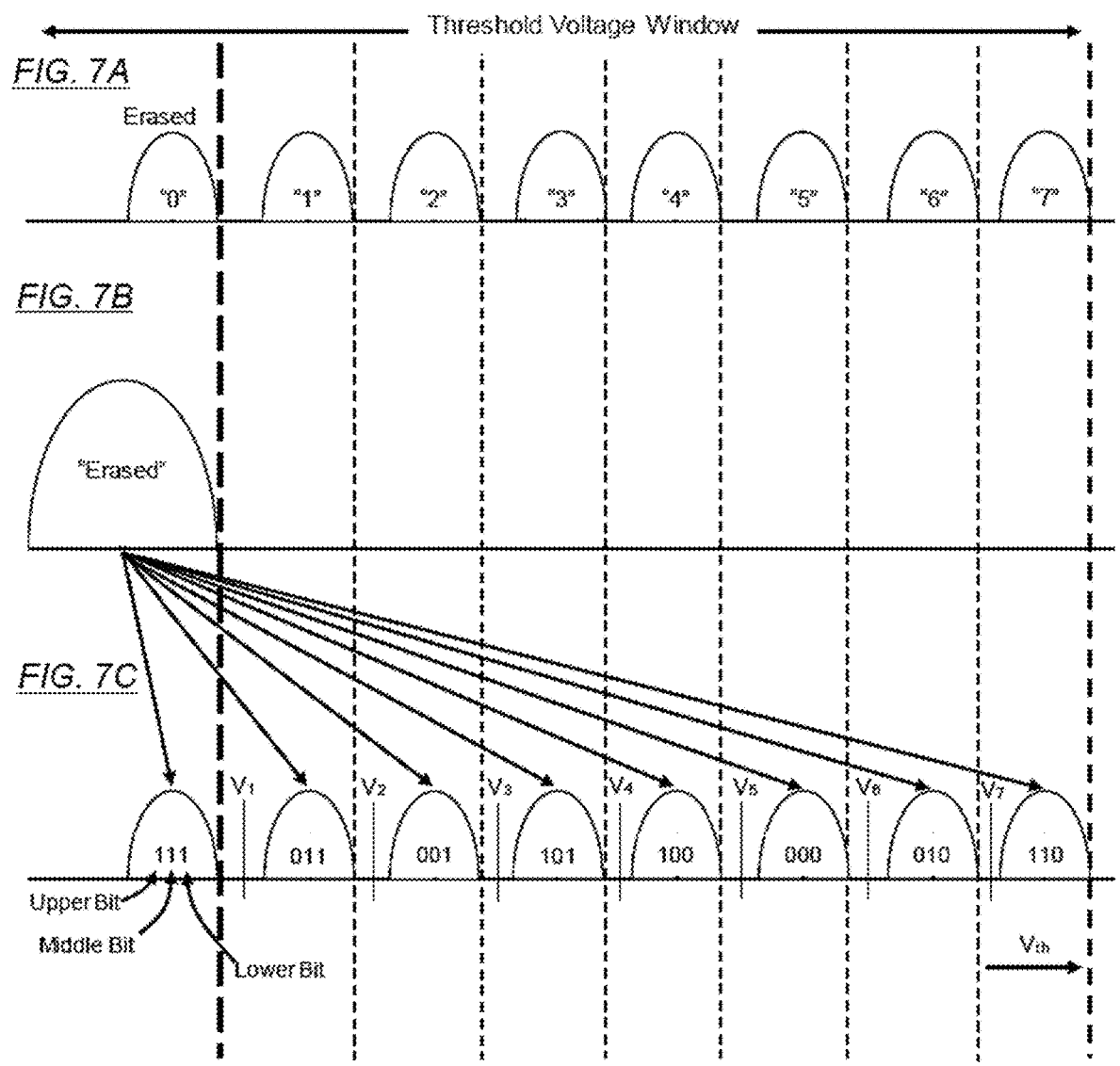
FIGS. 7A-7C depict stages of programming eight states of a population of TLC NAND-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels V1, V2, V3, V4, V5, V6, and V7. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values V1 through V7 in seven sub-passes respectively.

Figure 8:
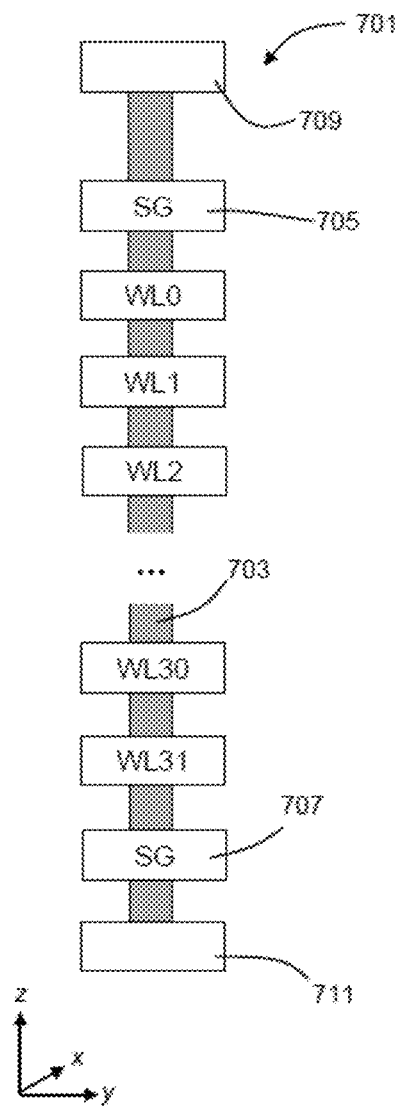
FIG. 8 depicts a vertical NAND-type string in accordance with an exemplary embodiment.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 8 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line-gate— coupled to the vertical bit line-channel— that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 8, the vertical NAND-type string 701 has 32 memory cells (i.e., at the juncture between local bit line 703 and word lines 0 through 31) connected in series. However, a NAND-type string 701 may comprise any suitable number of memory cells.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, BLm, of FIG. 5) each run across the top of the memory structure to an associated sense amplifier (e.g., SA0, SAm). Accordingly, the word lines (e.g., WL0, WLn, of FIG. 5), and the source and select lines (e.g., SSL0, SSLn, and DSL0, DSLn, respectively) extend in the x direction, with the bottom of each NAND string (e.g., string 50) connected to a common source line.

Figure 9:
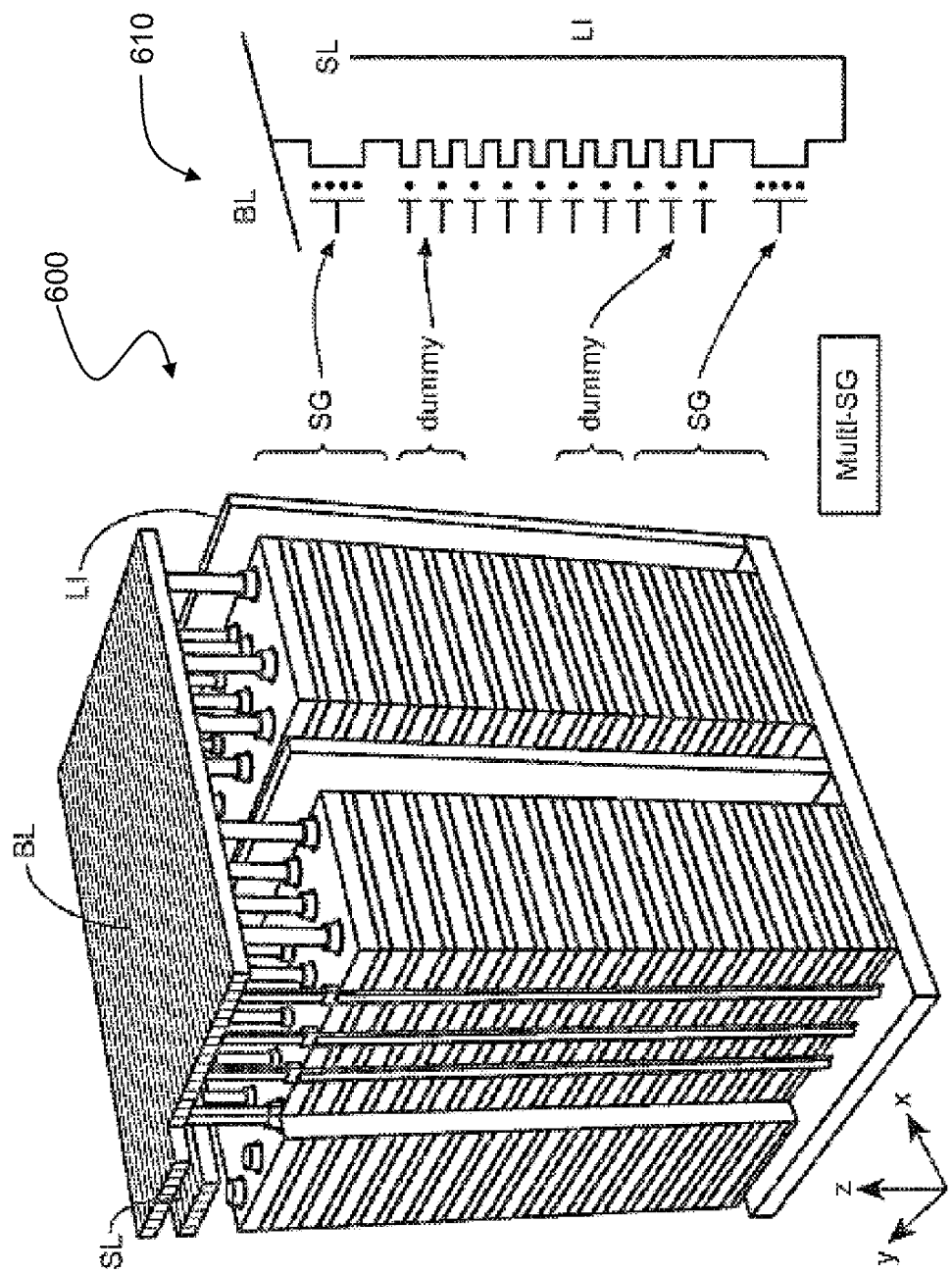
FIG. 9 is a perspective view of a representative subsection of a monolithic three-dimensional NAND-type memory array, in accordance with exemplary embodiments.

Referring now to FIG. 9, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 9 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS)

connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 10:
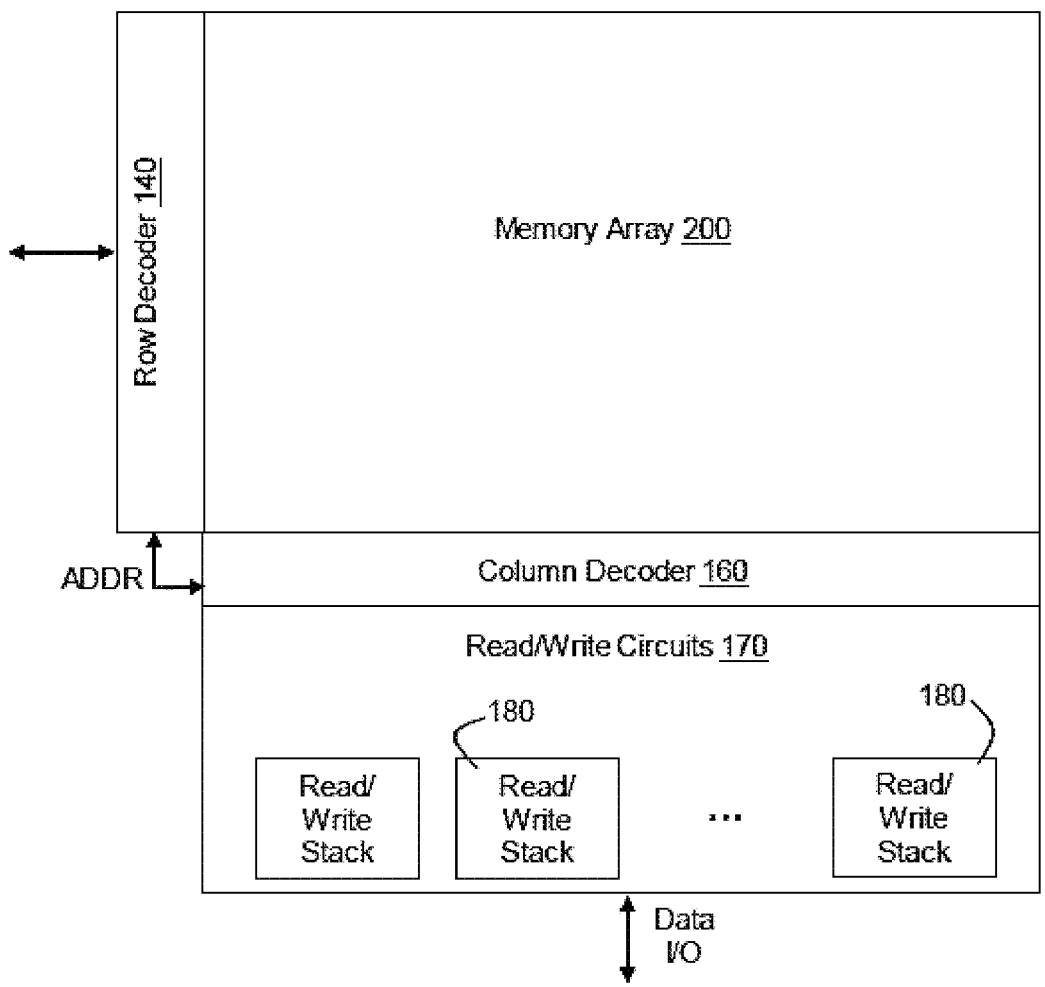
FIG. 10 schematically depicts a configuration of a non-volatile memory array that is accessible by read/write circuits via row and column decoders, in accordance with exemplary embodiments.
Figure 11:
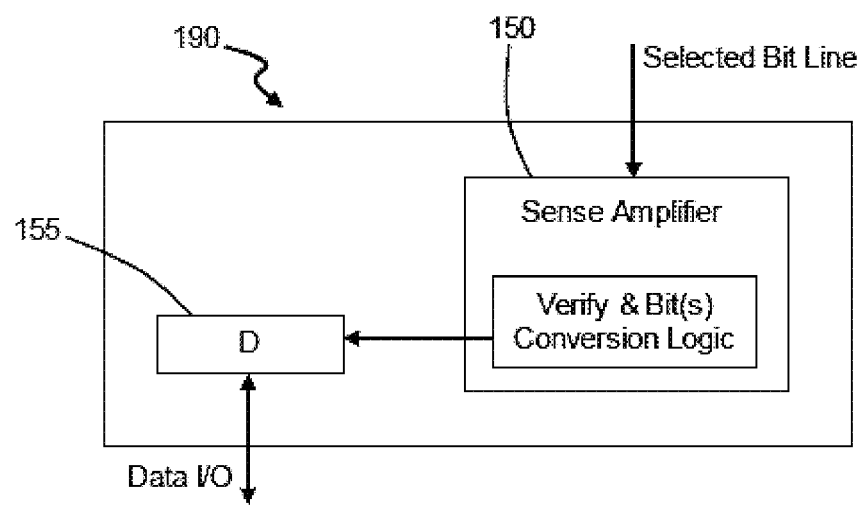
FIG. 11 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, the read/write circuits 170 are organized into banks of read/write stacks 180 wherein each read/write stack 180 is a stack of read/write modules 190.

Figure 12A:
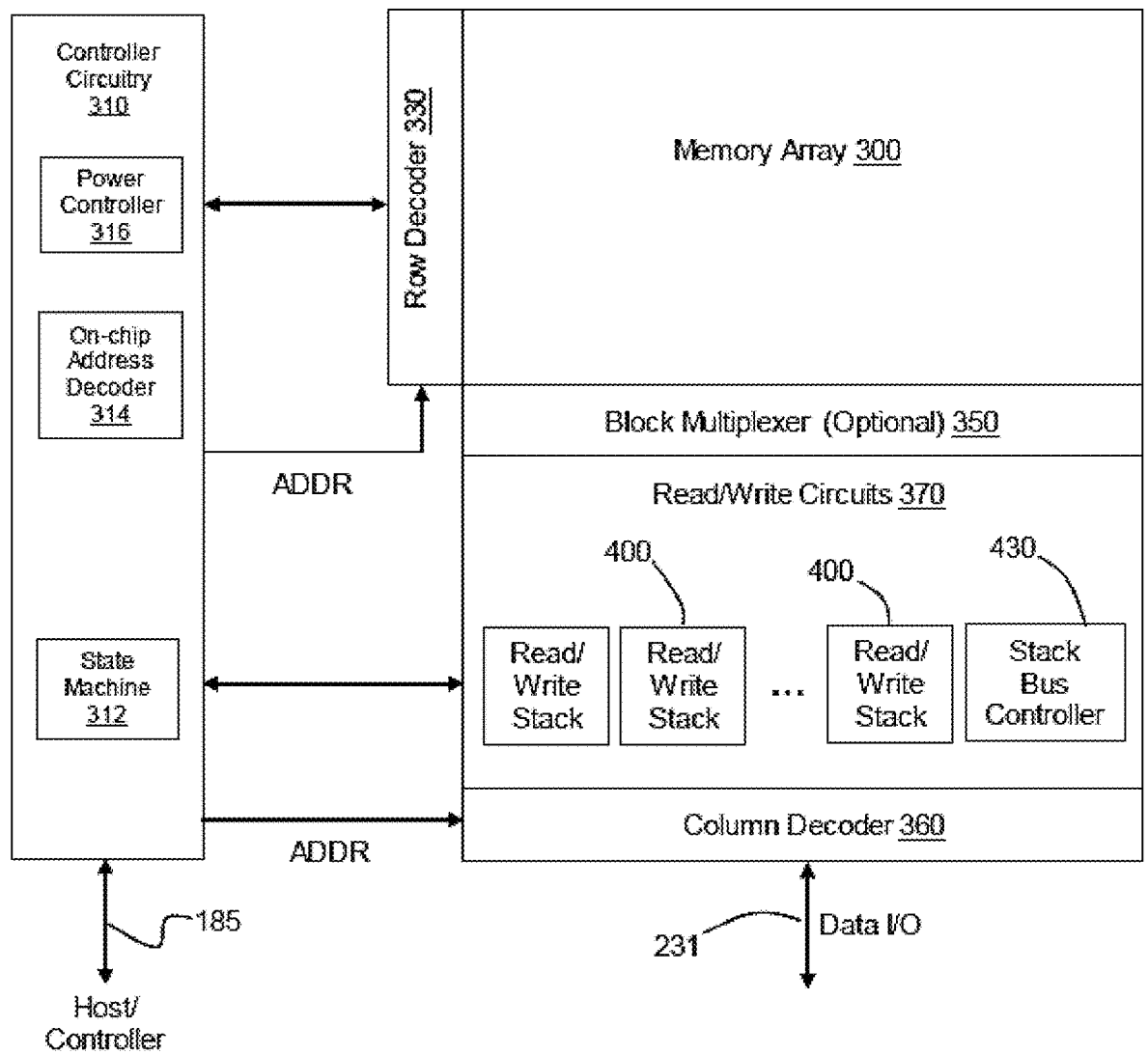
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
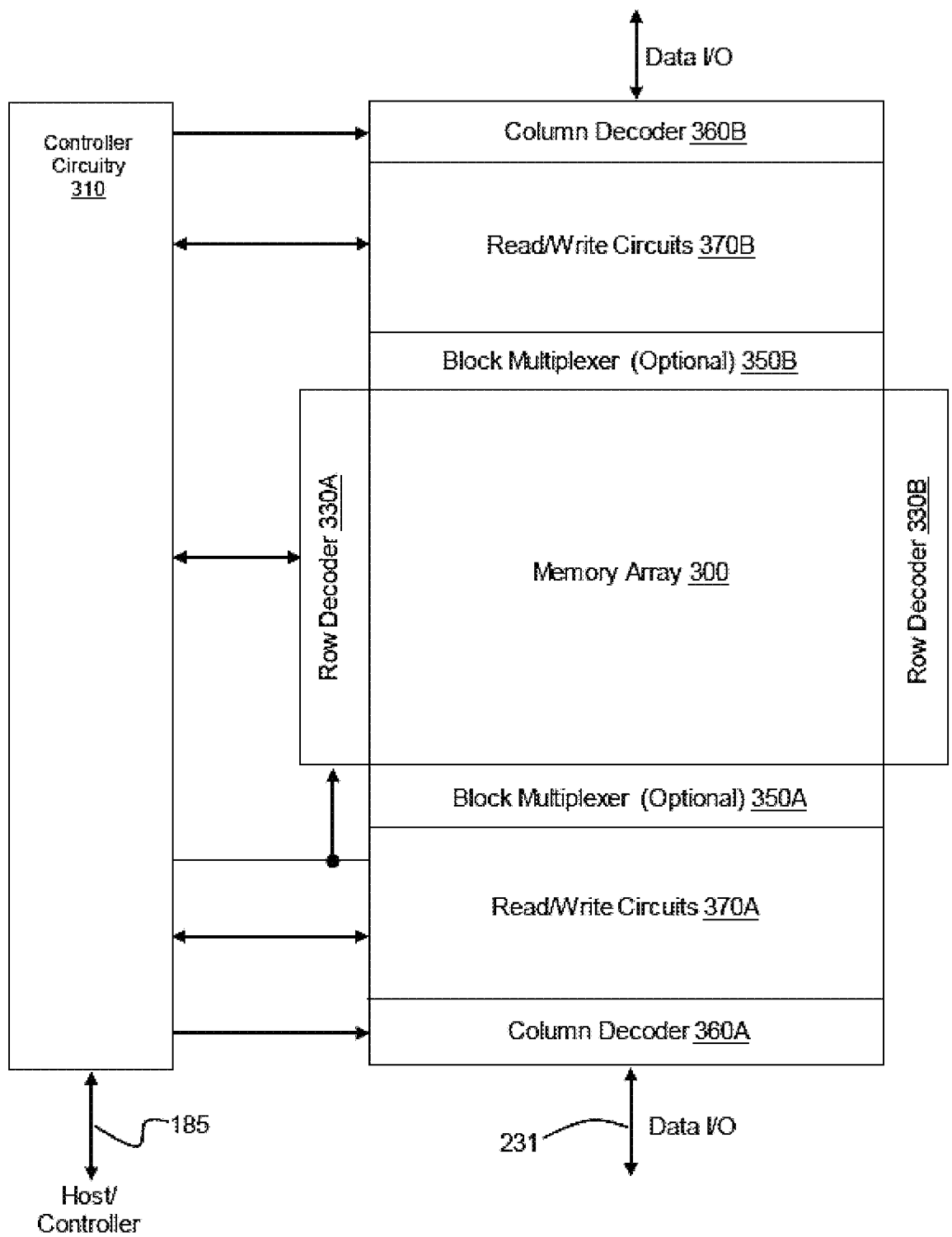
FIG. 12B schematically depicts the memory device of FIG. 11A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 13:
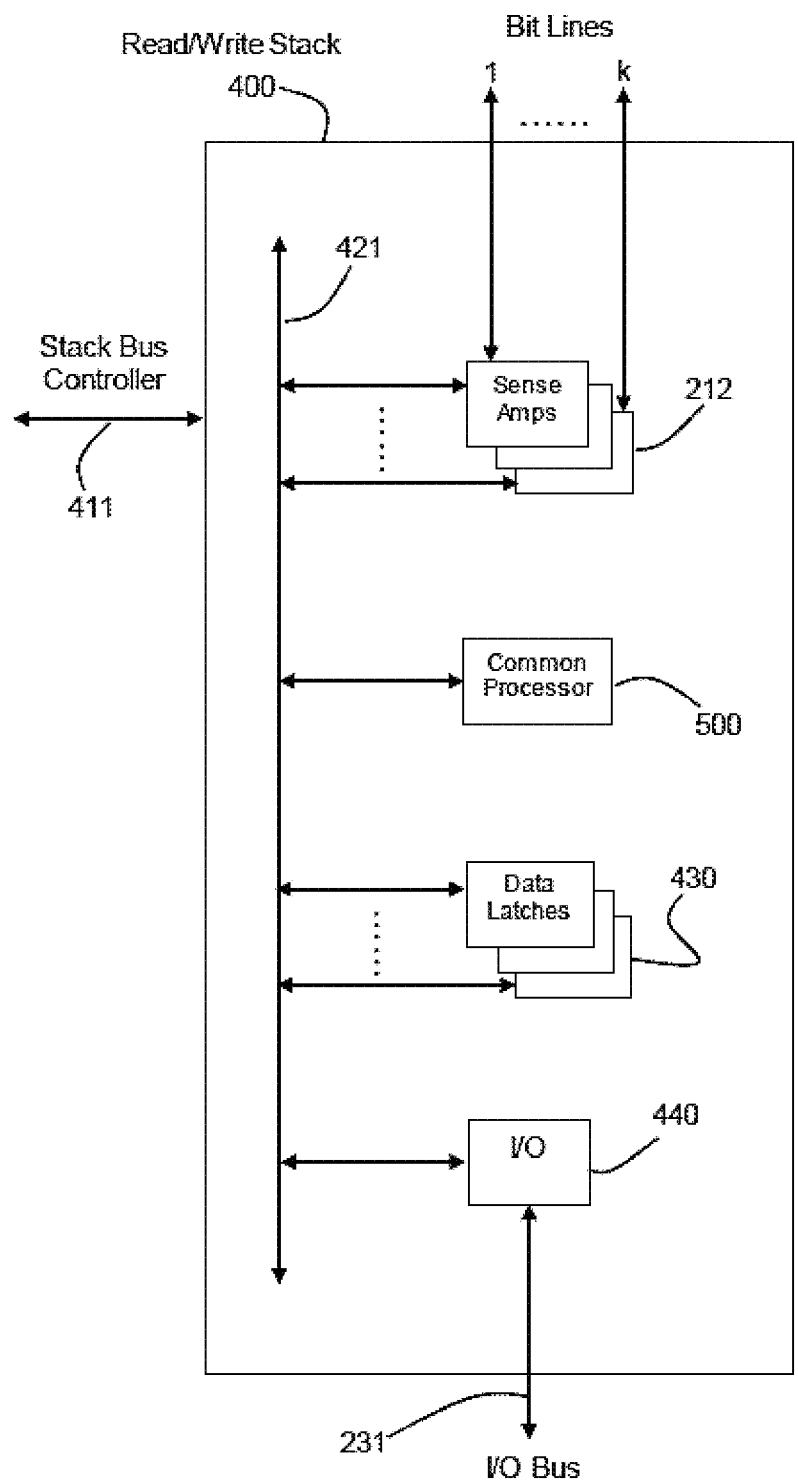
FIG. 13 schematically depicts various components of a read/write stack, such as the read/write stacks depicted in FIG. 11A, in accordance with exemplary embodiments.
Figure 14A:
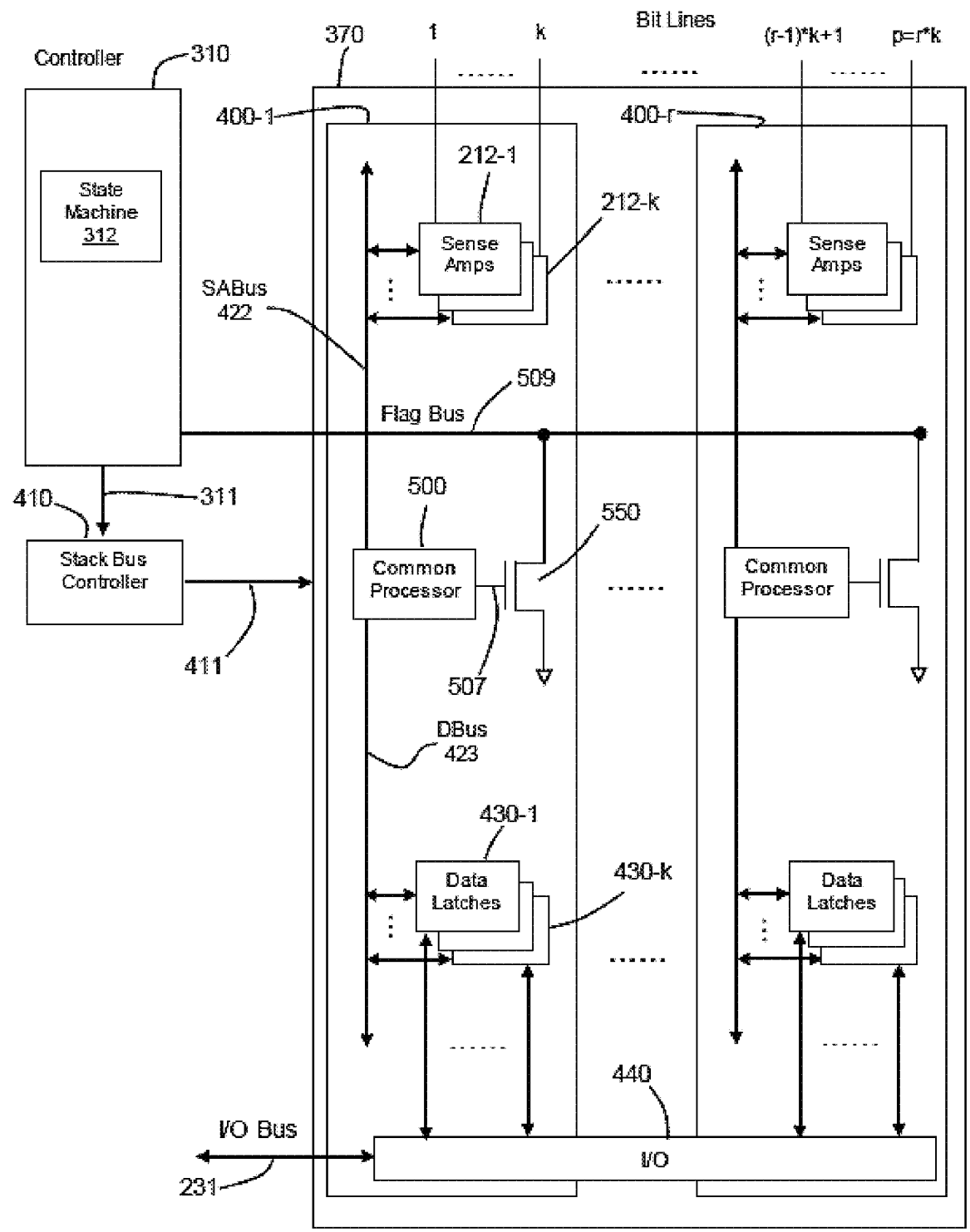
FIG. 14A schematically depicts a plurality of read/write stacks arranged amongst read/write circuits of a memory device, such as the memory device depicted in FIG. 11A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment of FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, ..., 212-k, and the DBus 423 provides a communication pathway between the common processor 500 and the stack of data latches 430-1, ..., 430-k. With respect to the common processor 500, it further comprises an output 507 for output of a status signal of a memory operation, such as an error condition. As is depicted in FIG. 14A, this status signal may, for example, be used to drive a gate of a n-transistor 550 that is tied to a Flag Bus 509 in a Wired—Or configuration, wherein the Flag Bus 509 is pre-charged by the controller 310 and is pulled down when a status signal is asserted by any of read/write stacks 400-1, ..., 400-r.

Figure 14B:
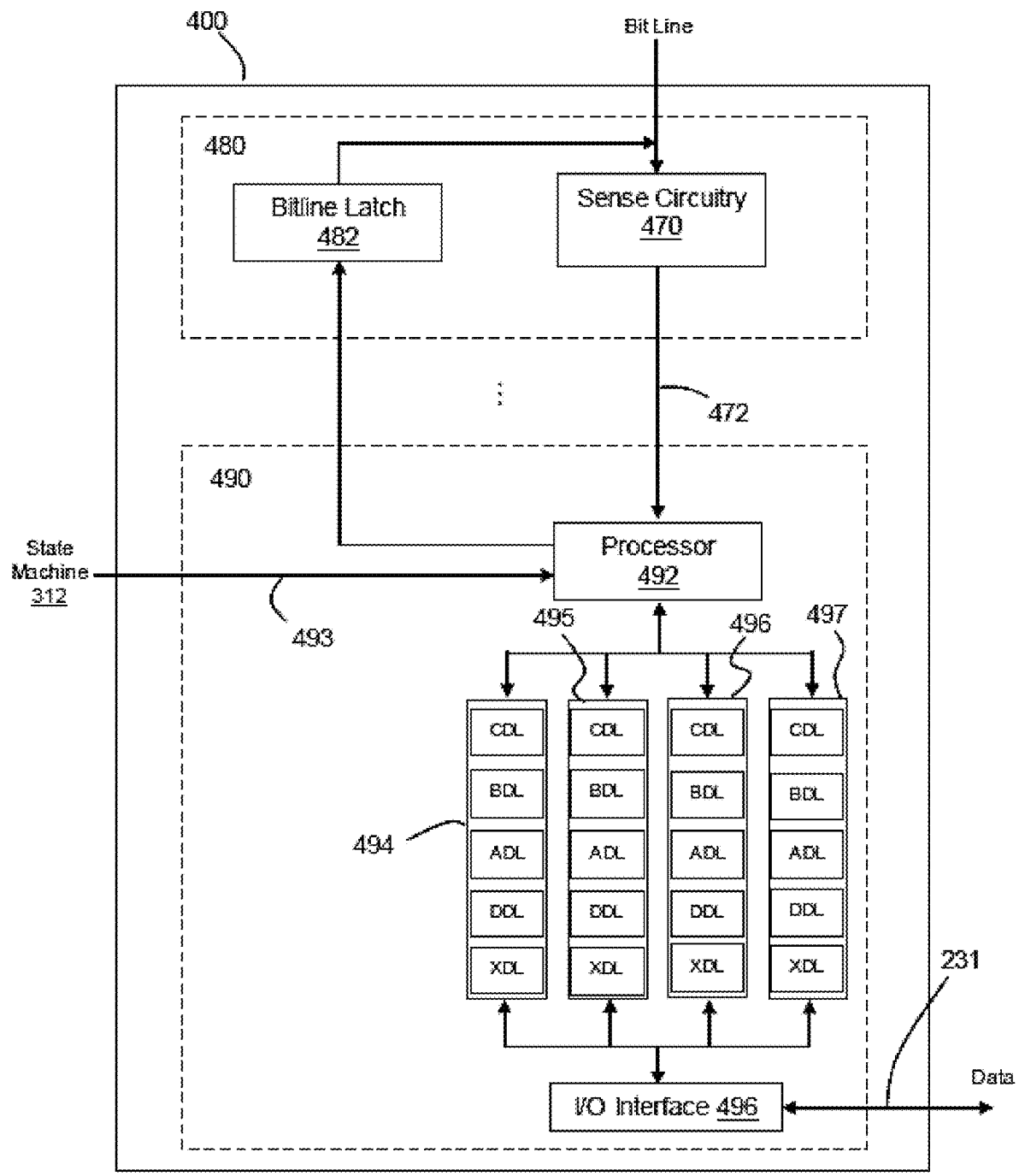
FIG. 14B is a block diagram depicting a sense block of a read/write stack, such as the read/write stacks depicted in FIG. 11A, in accordance with exemplary embodiments.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

Figure 15:
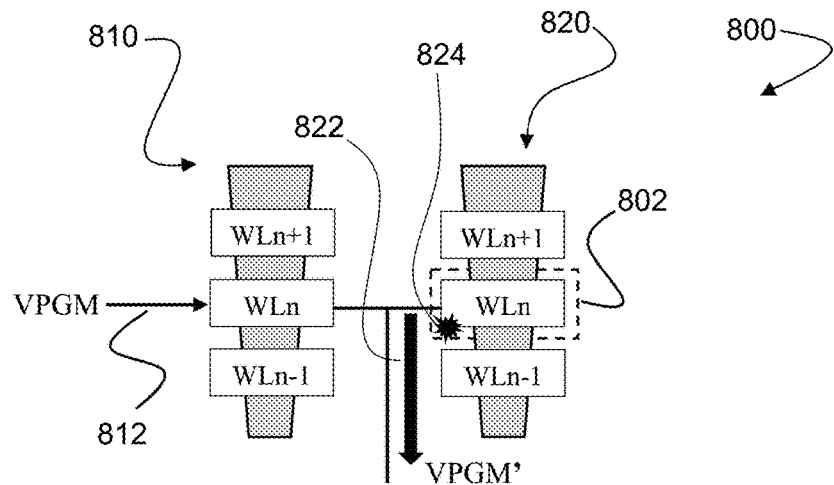
FIG. 15 generally depicts a neighbor plane disturb (NPD) condition with respect to a representative section of a three-dimensional NAND-type memory structure, in accordance with exemplary embodiments.

As mentioned above, these high storage density memory structures, such as the BiCS type described, for example, with respect to the exemplary embodiment shown in FIG. 9, have relatively small spacing between adjacent memory cells and each cell has a relatively small tolerance between discrete voltage ranges for memory functions. Accordingly, improving the amount of efficient storage capability within a fixed die size has competing drawbacks and liabilities. Therefore, various approaches and corrective and compensatory measures may be employed to improve the accuracy, reliability, and efficiency of the memory operations. Such measures aim, for example, at minimizing the interference between, for example, neighboring word lines (WL), and at fortifying short-term data retention with respect to scalable memory structures. Of particular interest here is the debilitating occurrence of a neighbor plane disturb (NPD) phenomenon as the result of one or more defective plane(s) within a scalable memory structure. In general terms, FIG. 15 illustrates a potential effect of an NPD condition within a representative section 800 of, for example, a three-dimensional NAND array. In this representative section 800, two neighboring planes, 810 and 820, are portrayed. Also in this depiction are three common word lines (WLs), referenced as WLn+1, WLn, and WLn-1, which are shared by the two planes 810, 820. In this specific example, plane 810 is non-defective and plane 820 is defective. A defective plane may be the result of a variety of manufacturing or operational defects, such as, for example, a word line-to-word line short 824. As a result of the defective plane 820, during a programming operation in which, for example, a programming voltage bias (VPGM) 812 is applied to word line WLn, the programming voltage bias (VPGM) may be pulled down 822 (i.e., reduced to a level VPGM', wherein VPGM'<VPGM) where it encounters the defective plane 820 at location 802. Consequently, all of the planes in the programming sequence occurring after point 802 will summarily fail (as detected during the subsequent program verify operations) irrespective of whether or not the downstream planes are defective. As mentioned above, this potentially catastrophic condition may be referred to as a neighbor plane disturb (NPD) condition. Various approaches and corrective and compensatory measures may be employed to counteract the programming disturbances or failures transpiring from an NPD condition occurring within a multi-plane memory structure.

Figure 16:
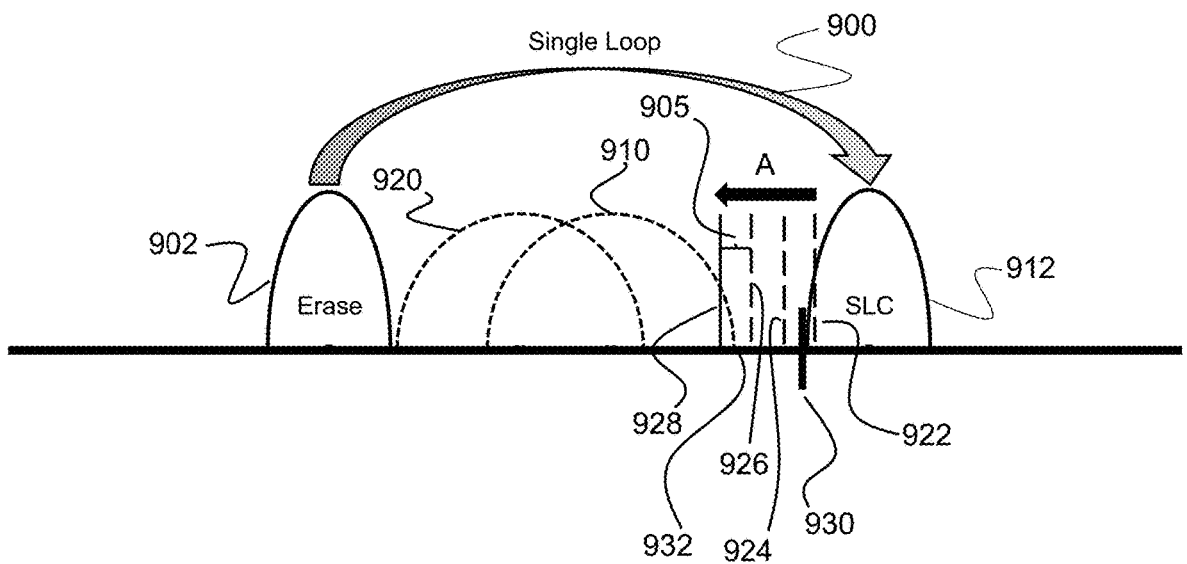
FIG. 16 depicts a methodology for identifying one or more defective planes within a memory structure during a program verify operation in a SLC-type programming loop, in accordance with exemplary embodiments.

For example, referring now to FIG. 16, there is shown an exemplary embodiment of a device mode for identifying and isolating one or more defective planes within a multi-plane memory structure in real time during, for example, a programming verify operation. More specifically, this particular device mode is applicable to pinpointing a defective memory plane during a SLC-type programming operation of a non-volatile memory structure. Therefore, the device mode operates within the parameters of a single programming loop (i.e., a single programming pulse and verify operation) and does not rely upon an analysis of multiple programming loops. Accordingly, for illustrative purposes, this exemplary device mode is depicted in FIG. 16 as operating within the environment or backdrop of a SLC-type (single) programming loop 900. Thus, as shown in FIG. 16, are the initial "erased" state 902 of a representative memory cell and the intended threshold voltage distribution curve 912 following the SLC-type programming operation. Also indicated in FIG. 16 is the program verify threshold voltage ($V_{th}$) level 930 according to its respective intended threshold voltage distribution curve 912. However, contrary to the intended program operation, the actual programming operation in this illustrative example has entirely failed as shown by the threshold voltage distribution curves 910, 920 (denoted by the dotted curves), wherein each distribution curve corresponds to a respective memory plane. As depicted, none of the actual programmed threshold voltage distribution curves 910, 920 exists or falls within the intended program verify threshold voltage ($V_{th}$) level 930 and, as a result, the program operation assumes a failed condition during a subsequent programming verify operation. This failure may be the result of a neighbor plane disturb (NPD) occurrence, as evidenced by the "pulling down" of, or decrease in the threshold voltage distribution curves 910, 920 of the two memory planes relative to the intended program threshold voltage distribution curve 912. Notwithstanding this seemingly global fail state, it is likely that the great majority of the memory structure is not defective and, if able to precisely identify and effectively isolate the defective portion, normal programming operations may otherwise resume. To accomplish this task, a device mode, according to the exemplary embodiment of FIG. 16, utilizes a relative comparison between the program threshold voltage distribution curve behavior as observed for a defective plane versus a non-defective plane. Specifically, according to the electrical behavior of a defective plane, it will exhibit the lowest program threshold voltage distribution curve in comparison to a program threshold voltage distribution curve of a non-defective plane within a memory structure. Thus, by detecting, for each memory plane, the upper tail of its respective program threshold voltage distribution curve, it is possible, through a stepwise process of elimination, to identify which of the planes exhibits the lowest program threshold voltage distribution curve(s) and is likely defective. Upon identifying which memory plane(s) is attributable to the program fail condition, the identified plane(s) may be isolated by applying a program "fail" status to the identified plane(s). Subsequently, the normal programming of the non-defective plane(s) comprising the memory device may be resumed by resetting the programming voltage bias (VPGM) to the initial VPGM, [Fw1] and reprogramming the memory device accordingly, thereby providing a practical and effective countermeasure to the presence of an NPD condition.

Referring still to FIG. 16, there is depicted an exemplary methodology for precisely detecting the upper tail of a program threshold voltage distribution curve of each memory plane, as demonstrated with respect to the illustrative case in FIG. 16. As discussed above, FIG. 16 represents a SLC-type programming operation that is comprised of a single programming loop applied to two memory planes, wherein the respective program threshold voltage distribution curves 910, 920 of both memory planes fall outside the intended program threshold voltage distribution curve 912, according to the program verify threshold voltage ($V_{th}$) level 930. Upon detection of this fail program state, a word line verify voltage (VCGRV) scan is initiated with a bit scan pass fail criterion (BSPF), beginning at a starting voltage level 922 that is known to fall within the intended program threshold voltage distribution curve 912. Importantly, the starting voltage level 922 can be selected by pre-programmed parameter options of the memory device, and must be set at a voltage level that is at least higher than the respective threshold voltage distribution curves 910, 920 in order to ensure detection of the upper tail(s). At this point, the word line verify voltage (VCGRV) is incrementally decreased by a predetermined offset voltage 905 in the direction of arrow "A," as depicted in FIG. 16, which direction is assured to, at the earliest, encounter the upper tail portion of the program threshold voltage distribution curve of each of the respective plane(s) of the memory device. As such, the predetermined offset voltage 905 is the step size of the VCGRV scan and can be determined by pre-programmed parameter options of the memory device. It should be noted that the smaller the step size, the higher the resolution of the upper tail detection mechanism. However, the smaller step size requires more scan points and, therefore, takes a relatively longer time to conduct. Conversely, the larger the step size, the lower the resolution. Thus, the value of the predetermined voltage offset 905 may be optimized to find a suitable balance between resolution and efficiency.

Referring still to FIG. 16, at a beginning step, a program verify operation is conducted according to a starting voltage level 922 of the word line verify voltage (VCGRV) scan and is followed by a bit scan operation that determines the "0" bit count (i.e., the number of non-conducting bits with a threshold voltage that is higher than the voltage level 922). Thereafter, the "0" bit count is compared with a bit scan pass fail criterion (BSPF). Specifically, if the "0" bit count is smaller than BSPF, the program verify voltage (VCGRV) is decreased by the predetermined offset voltage 905 to a second voltage level 924. If, at this second voltage level 924, the "0" bits count is determined to be either greater than or equal to the bit scan pass fail criterion (BSPF) according to the initiated bit scan operation, this signifies or indicates that the second voltage level 924 proximately falls within the voltage range of an upper tail portion of a program voltage distribution ($V_{th}$) curve of a memory plane of the device. Accordingly, at this juncture, the second voltage level 924 is stored as an upper tail value of its respective plane. Oppositely, if, at this second voltage level 924, the "0" bits count is less than the BSPF, this indicates that the second voltage level 924 falls outside of a voltage distribution curve of any memory plane of the device. Accordingly, at this point, to continue the upper tail detection procedure, the word line verify voltage (VCGRV) level is again decreased by the predetermined offset value 905. This incremental process continues until the upper tail value of each memory plane of the device is identified. In the illustrative example set forth in FIG. 16, the word line verify voltage (VCGRV) level is decreased three times (referenced in FIG. 16 as voltage levels 924, 926, and 928) before the target condition of the "0" bits count being either greater than or equal to the BSPF is first obtained. As illustrated in FIG. 16, voltage level 928 is the earliest incremental value that resides within the upper tail portion (which begins at leading curve edge 932) of the program voltage distribution curve 910. Accordingly, in this particular example, voltage level 928 is stored as the upper tail value of its respective program voltage distribution curve 910.

Continuing further, after each of the upper tail values are identified for each programmable memory plane of the memory device, the one or more upper tail values are compared and, as discussed above, the one or more memory planes exhibiting the lowest upper tail values are empirically assumed to be defective. In the illustrative example in FIG. 16, only two memory planes are present and, therefore, by process of elimination, the memory plane exhibiting the program voltage distribution curve 920 is assumed to be defective, whereas the memory plane exhibiting the program voltage distribution curve 910 is assumed to be non-defective as the upper tail portion of curve 910 is first encountered during the bit scan mode procedure just described.

Figure 17:
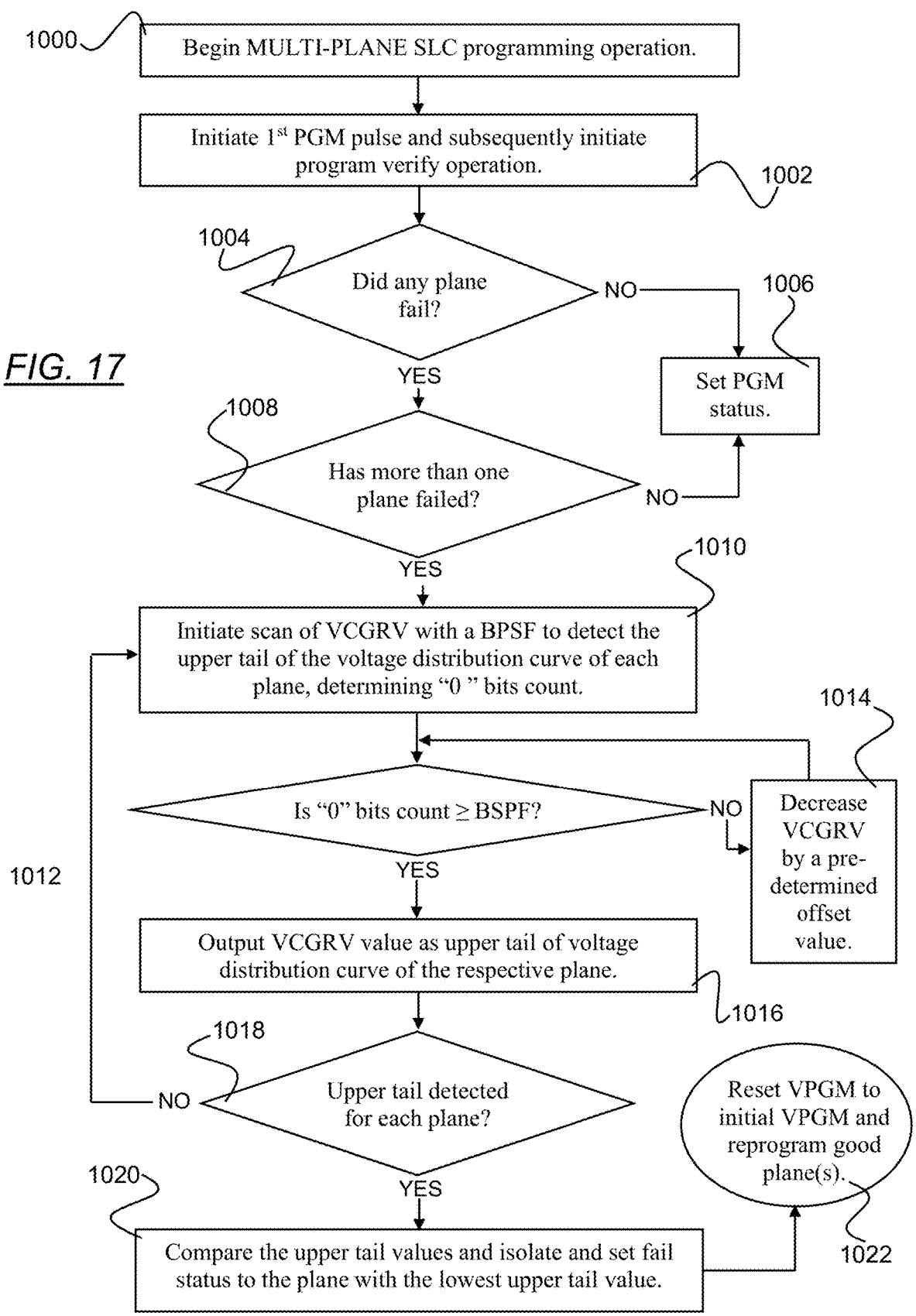
FIG. 17 is a flow diagram generally illustrating the steps of a procedure for, first, identifying one or more defective planes according to the embodiment of FIG. 16, and second, isolating the identified defective plane(s) and reestablishing a normal programming operation of non-defective plane(s) within the memory structure, in accordance with exemplary embodiments.

Referring now to FIG. 17, there is provided a flow diagram illustrating a general framework of a SLC-type programming scheme, wherein an identification/detection process in accordance with the exemplary embodiment of FIG. 16 is incorporated therein to isolate one or more defective memory plane(s) of a subject memory structure and to reestablish the normal programming operation of the one or more non-defective memory plane(s) of the memory structure. Beginning at a step 1000, a multi-plane, SLC-type program sequence or operation commences, in which a first program pulse is initiated and, subsequently, a program verify operation is conducted (see step 1002). Specifically, in a program verify operation, a sensing operation will be conducted for each memory cell in program state (i.e., SLC "0" state) to determine whether the threshold voltage of a respective programmed memory cell is above or below the program verify voltage level. Subsequently, the number of memory cells having threshold voltages falling below the verify voltage level will be counted according to a bit scan operation, and compared with a bit scan pass fail criterion (BSPF) to determine whether the programming has passed or failed. And if, during the program verify operation, the actual programmed threshold voltages of the plane(s) of the memory structure are detected or are confirmed to be higher than the intended read/verify voltage level, the program operation is considered successful (pass) and the corresponding status is set to "pass" (see steps 1004 and 1006). If, however, at step 1004, the actual programmed threshold voltages are detected to be lower than the intended verify voltage level, and the number of memory cells with threshold voltages lower than the verify voltage level is larger than the bit scan pass fail criterion, the programming operation is considered to have failed. If all planes pass the program verify, all planes are considered to be good, and this program tail plane comparator mode will not be triggered. However, if only one plane fails the program verify, while other plane(s) pass, the program status of the failing plane will be set to fail, and the program status of other passing plane(s) will be set to pass. Accordingly, in this circumstance, it is apparent which of the planes is truly defective since it is the only plane that has failed. As such, this program tail plane comparator device mode will not be triggered. However, should more than one plane fail the program verify, the detection mode described in detail above in connection with FIG. 16 is performed. Specifically, a word line verify voltage (VCGRV) scan is initiated with a bit scan operation according to a bit scan pass fail criterion (BSPF), in order to precisely detect the upper tail portion of the program threshold voltage distribution curve of each memory plane, by determining the "0" bits count (see step 1010). Again, the upper tail portion of the program threshold voltage distribution curve of each plane is systematically identified by incrementally decreasing the operative VCGRV scan level by a predetermined offset voltage value until the condition in which the "0" bits count is greater than or equal to the BSPF is obtained (see steps 1012 and 1014). Once this specific condition is reached, the associated VCGRV level is then outputted and stored as the upper tail value of its respective memory plane (see step 1016). The preceding steps are repeated until the upper tail values of all of the respective subject memory planes are identified (see step 1018). Once all upper tail values are identified, a comparison between upper tail values is performed and the memory plane(s) exhibiting the lowest upper tail value(s) is/are determined to be defective. Thereafter, the defective plane(s) is/are isolated from the surrounding memory structure by designating the defective plane(s) a fail status (see step 1020).

Thereafter, having isolated the one or more defective memory plane(s), the normal programming of the one or more non-defective planes may resume, or be reestablished, by resetting the programming voltage bias (VPGM) to its initial voltage bias level, same as the first programming pulse.

The above discussion is meant to be illustrative of the principles and various embodiments of the present invention. Numerous variations and modifications will become apparent to those skilled in the art once the above disclosure is fully appreciated. For example, although on-memory controllers have been described as performing or controlling the methods that are described above, any processor executing software within a host system can perform the methods described above without departing from the scope of the disclosure. In particular, the methods and techniques described herein as performed in the on-memory controller(s), may also be performed in a host. Furthermore, the methods and concepts disclosed herein may be applied to other types of persistent memories other than flash. It is intended that the following claims be interpreted to embrace all such variations and modifications.

What is claimed is:

1. A method for detecting and isolating one or more defective memory planes of a non-volatile memory structure, comprising:
   during a program verify operation in which it is determined a programming memory operation of more than one memory plane has failed, for each memory plane of the memory structure:
      initiating a word line verify voltage level (VCGRV) scan according to a bit scan pass fail criterion (BSPF), and at a starting voltage level located within an intended program threshold voltage distribution curve according to the programming memory operation;
      incrementally decreasing the word line verify voltage level by a predetermined offset voltage level until a specific condition of the word line verify voltage level scan is obtained; and
      storing the voltage level at which the specific condition of the word line verify voltage level scan is obtained, wherein the stored word line verify voltage represents a voltage of an upper tail portion of an actual programmed threshold voltage distribution curve of the corresponding memory plane;
   comparing the stored word line verify voltage levels of all of the memory planes of the memory structure to determine which of the planes corresponds to the lowest stored word line verify voltage level; and
   applying a fail status to the memory plane corresponding to the lowest stored word line verify voltage level.

2. The method according to claim 1, further comprising: reprogramming all memory planes other than the memory plane having the fail status, wherein a programming voltage bias corresponding to an initial programming voltage of the programming memory operation is applied to each memory plane.

3. The method according to claim 1, wherein the specific condition of the word line verify voltage level scan is comprised of a "0" bits count being greater than or equal to the bit scan pass fail criterion (BSPF).

4. The method according to claim 1, wherein the program verify operation is a stage of a SLC-type programming sequence.

5. The method according to claim 1, wherein the failure of the programming memory operation is due to a neighbor plane disturb condition.

6. The method according to claim 1, wherein the starting voltage level is a voltage level greater than the actual programmed threshold voltage distribution curve of the corresponding memory plane.

7. The method according to claim 1, wherein the predetermined offset voltage level corresponds to a step size that is optimized according to resolution and efficiency parameters.

8. A memory controller, comprising:
   a first port configured to couple to a non-volatile memory, the memory comprising a memory structure; and
   the memory controller configured to:
      during a program verify operation in which it is determined a programming memory operation of more than one memory plane of the structure has failed, for each memory plane:
         initiate a word line verify voltage level (VCGRV) scan according to a bit scan pass fail criterion (BSPF) at a starting voltage level located within an intended program threshold voltage distribution curve according to the programming memory operation;
         incrementally decrease the word line verify voltage level by a predetermined offset voltage level until a specific condition of the word line verify voltage level scan is obtained; and
         store the voltage level at which the specific condition of the word line verify voltage level scan is obtained, wherein the stored word line verify voltage level represents a voltage of an upper tail portion of an actual programmed threshold voltage distribution curve of the corresponding memory plane;
      compare the stored word line verify voltage levels of all of the memory planes of the memory structure to determine which of the planes corresponds to the lowest stored word line verify voltage level; and
      apply a fail status to the memory plane corresponding to the lowest stored word line verify voltage level.

9. The memory controller according to claim 8, wherein the memory controller is further configured to reprogram all memory planes other than the memory plane having the fail status, wherein a programming voltage bias corresponding to an initial programming voltage of the programming memory operation is applied to each memory plane.

10. The memory controller according to claim 8, wherein the specific condition of the word line verify voltage level scan is comprised of a "0" bits count being greater than or equal to the bit scan pass fail criterion (BSPF).

11. The memory controller according to claim 8, wherein the program verify operation is a stage of a SLC-type programming sequence.

12. The memory controller according to claim 8, wherein the failure of the programming memory operation is due to a neighbor plane disturb condition.

13. The memory controller according to claim 8, wherein the starting voltage level is a voltage level greater than the actual programmed threshold voltage distribution curve of the corresponding memory plane.

14. The memory controller according to claim 8, wherein the predetermined offset voltage level corresponds to a step size that is optimized according to resolution and efficiency parameters.

15. A non-volatile memory system, comprising:
   a memory structure;
   a memory controller coupled to the memory structure and:
      during a program verify operation in which it is determined a programming memory operation of more than one memory plane of the structure has failed, for each memory plane:

initiating a word line verify voltage level (VCGRV) scan according to a bit scan pass fail criterion (BSPF) at a starting voltage level located within an intended program threshold voltage distribution curve according to the programming memory operation;

incrementally decreasing the word line verify voltage level by a predetermined offset voltage level until a specific condition of the word line verify voltage level scan is obtained; and storing the voltage level at which the specific condition of the word line verify voltage level scan is obtained, wherein the stored word line verify voltage level represents a voltage of an upper tail portion of an actual programmed threshold voltage distribution curve of the corresponding memory plane;

comparing the stored word line verify voltage levels of all of the memory planes of the memory structure to determine which of the planes corresponds to the lowest stored word line verify voltage level; and applying a fail status to the memory plane corresponding to the lowest stored word line verify voltage level.

16. The non-volatile memory system according to claim 15, further comprising the memory controller:

reprogramming all memory planes other than the memory plane having the fail status, wherein a programming voltage bias corresponding to an initial programming voltage of the programming memory operation is applied to each memory plane.

17. The non-volatile memory system according to claim 15, wherein the specific condition of the word line verify voltage level scan is comprised of a "0" bits count being greater than or equal to the bit scan pass fail criterion (BSPF).

18. The non-volatile memory system according to claim 15, wherein the program verify operation is a stage of a SLC-type programming sequence.

19. The non-volatile memory system according to claim 15, wherein the failure of the programming memory operation is due to a neighbor plane disturb condition.

20. The non-volatile memory system according to claim 15, wherein the predetermined offset voltage level corresponds to a step size that is optimized according to resolution and efficiency parameters.

* * * * *